United States Patent
Jeong et al.

(10) Patent No.: US 8,295,089 B2
(45) Date of Patent: Oct. 23, 2012

(54) NON-VOLATILE MEMORY DEVICE HAVING VERTICAL STRUCTURE AND METHOD OF OPERATING THE SAME

(75) Inventors: Jae-hun Jeong, Hwaseong-si (KR); Han-soo Kim, Suwon-si (KR); Won-seok Cho, Suwon-si (KR); Jae-hoon Jang, Seongnam-si (KR); Sun-il Shim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 308 days.

(21) Appl. No.: 12/658,072

(22) Filed: Feb. 2, 2010

(65) Prior Publication Data

US 2010/0195395 A1    Aug. 5, 2010

(30) Foreign Application Priority Data

Feb. 2, 2009   (KR) .................. 10-2009-0008041
Sep. 3, 2009   (KR) .................. 10-2009-0083148

(51) Int. Cl.
    *G11C 16/04*    (2006.01)
(52) U.S. Cl. .................. 365/185.17; 365/185.11
(58) Field of Classification Search ............. 365/185.17, 365/185.11
    See application file for complete search history.

(56) References Cited

U.S. PATENT DOCUMENTS

| | | | |
|---|---|---|---|
| 5,940,321 A | 8/1999 | Takeuchi et al. | |
| 6,307,785 B1 | 10/2001 | Takeuchi et al. | |
| 7,701,771 B2 | 4/2010 | Jeong et al. | |
| 8,004,893 B2 | 8/2011 | Sim et al. | |
| 2004/0125629 A1 | 7/2004 | Scheuerlein et al. | |
| 2006/0050559 A1 | 3/2006 | Sakui et al. | |
| 2007/0070708 A1* | 3/2007 | Ichige et al. | 365/185.28 |
| 2007/0158736 A1 | 7/2007 | Arai et al. | |
| 2008/0031048 A1 | 2/2008 | Jeong et al. | |
| 2008/0173932 A1 | 7/2008 | Kidoh et al. | |
| 2008/0225594 A1* | 9/2008 | Lee et al. | 365/185.17 |
| 2009/0091975 A1 | 4/2009 | Lee et al. | |
| 2009/0140313 A1* | 6/2009 | Joo | 257/314 |
| 2009/0168533 A1 | 7/2009 | Park et al. | |
| 2009/0184360 A1* | 7/2009 | Jin et al. | 257/319 |
| 2009/0238003 A1 | 9/2009 | Namiki et al. | |
| 2010/0322000 A1 | 12/2010 | Shim et al. | |

FOREIGN PATENT DOCUMENTS

| | | |
|---|---|---|
| JP | 2007-180389 A | 7/2007 |
| JP | 2007-317874 A | 12/2007 |
| JP | 2008-171918 A | 7/2008 |
| JP | 2009-94479 | 4/2009 |
| KR | 10-0850508 | 8/2008 |
| KR | 10-2009-0035203 | 4/2009 |
| KR | 10-2009-0072406 | 7/2009 |

* cited by examiner

*Primary Examiner* — Hoai V Ho
(74) *Attorney, Agent, or Firm* — Onello & Mello, LLP

(57) ABSTRACT

A non-volatile memory device having a vertical structure includes a NAND string having a vertical structure. The NAND string includes a plurality of memory cells, and at least one pair of first selection transistors arranged to be adjacent to a first end of the plurality of memory cells. A plurality of word lines are coupled to the plurality of memory cells of the NAND string. A first selection line is commonly connected to the at least one pair of first selection transistors of the NAND string.

10 Claims, 16 Drawing Sheets

NON-VOLATILE MEMORY DEVICE HAVING VERTICAL STRUCTURE AND METHOD OF OPERATING THE SAME

CROSS-REFERENCE TO RELATED APPLICATIONS

This application claims the benefit of Korean Patent Application No. 10-2009-0008041, filed on Feb. 2, 2009 and Korean Patent Application No. 10-2009-0083148, filed on Sep. 3, 2009, in the Korean Intellectual Property Office, the disclosures of which are incorporated herein in their entirety by reference.

BACKGROUND

The inventive concept relates to a semiconductor device, and more particularly, to a non-volatile memory device having a vertical structure and a method of operating the same.

Although electronic devices have become continually reduced in size, they are nevertheless required to process a large amount of data. Thus, in order to reduce size while maintaining or improving upon processing capabilities, non-volatile memory devices for use in such electronic devices need to be reduced in size while increasing the integration degree thereof. To this end, non-volatile memory devices having a vertical structure have been considered instead of those having a conventional flat structure. However, non-volatile memory devices having a vertical structure are complicated to manufacture, and thus, the reliability thereof tends to be lower than more conventional memory devices having a flat structure.

SUMMARY

In accordance with aspects of the present invention, provided is a non-volatile memory device having a vertical structure, with increased reliability, and a method of operating the same.

According to an aspect of the inventive concept, there is provided a non-volatile memory device having a vertical structure. The non-volatile memory device includes a substrate; a semiconductor pole formed on the substrate to extend vertically with respect to the substrate; a NAND string formed on the substrate to extend vertically with respect to the substrate and along sidewalls of the semiconductor pole, the NAND string including a plurality of memory cells and at least one pair of first selection transistors adjacent to a first end of the plurality of memory cells; a plurality of word lines coupled to the plurality of memory cells of the NAND string; and a first selection line being commonly coupled to the at least one pair of first selection transistors of the NAND string.

In the non-volatile memory device, a bit line may be connected to a first end of the NAND string, and a common source line may be connected to a second end of the NAND string opposite to the bit line.

The at least one pair of first selection transistors may be arranged between the bit line and the plurality of memory cells.

The at least one pair of first selection transistors may be arranged between the common source line and the plurality of memory cells.

The NAND string may further include at least one pair of second selection transistors that are adjacent to a second end of the plurality of memory cells and opposite to the at least one pair of first selection transistors.

The non-volatile memory device may further include a second selection line commonly connected to the at least one pair of second selection transistors of the NAND string.

According to another aspect of the inventive concept, there is provided a non-volatile memory device having a vertical structure. The non-volatile memory device including a substrate; a plurality of semiconductor poles formed on the substrate to extend vertically with respect to the substrate, and arranged in a matrix; a plurality of NAND strings formed on the substrate to extend vertically with respect to the substrate and along sidewalls of the semiconductor poles to form a matrix of rows and columns of NAND strings, the NAND strings each including a plurality of memory cells and at least one pair of first selection transistors adjacent to a first end of the plurality of memory cells; a plurality of bit lines, each bit line commonly connected to a first end of each NAND string in a same row of NAND strings from the plurality of NAND strings; a common source line commonly connected to a second end of each NAND string in the plurality of NAND strings, and opposite to the plurality of bit lines; a plurality of word lines, each word line commonly coupled to memory cells arranged at a same level from the plurality of memory cells of the plurality of NAND strings; and a plurality of first selection lines, each first selection line commonly coupled to the at least one pair of first selection transistors of each NAND string in a same column of NAND strings from among the plurality of NAND strings.

The plurality of memory cells may include control gate electrodes on the sidewalls of the plurality of semiconductor poles, and the at least one pair of first selection transistors may include first gate electrodes on the sidewalls of the plurality of the semiconductor poles.

A difference between a gate length of each of the control gate electrodes and a gate length of each of the first gate electrodes may be in a range of about 0 nm to 10 nm.

A gate length of each of the first gate electrodes may be less than or equal to the distance between first gate electrodes arranged in a same level between adjacent semiconductor poles.

A gate length of each of the control gate electrodes may be less than or equal to the distance between control gate electrodes arranged in a same level between adjacent semiconductor poles.

Each of the NAND strings can further include at least one pair of second selection transistors adjacent to a second end of the plurality of memory cells and opposite to the at least one pair of first selection transistors.

The non-volatile memory device may further include a plurality of second selection lines, each second selection line commonly coupled to the at least one pair of second selection transistors of each NAND string in a same column of NAND strings from the plurality of NAND strings.

According to another aspect of the inventive concept, there is provided a method of operating a non-volatile memory device. The method including applying a program voltage to one memory cell selected from among a plurality of memory cells of a NAND string from a plurality of vertically arranged NAND strings, and applying a pass voltage to the remaining memory cells of the NAND string, where the pass voltage is less than the program voltage; and applying a first voltage to a first selection transistor closest to the plurality of memory cells in the NAND string, the first selection transistor from a pair of first selection transistors that is adjacent to a first end of the plurality of memory cells in the NAND string, and applying a second voltage to a remaining first selection transistor from the pair of first selection transistors, where the second voltage is less than the first voltage.

The first voltage may be substantially equal to the pass voltage.

The second voltage may be equal to or greater than a threshold voltage of the remaining first selection transistor.

The method may further include applying 0V to a pair of second selection transistors that is adjacent to a second end of the plurality of memory cells in the NAND string and opposite to the pair of first selection transistors.

The method may further include applying 0V to a bit line connected to a first end of one of the plurality of NAND strings so that data stored in a memory cell selected from among the plurality of memory cells of the NAND string is programmed.

The method may further include applying an operational voltage to a bit line connected to one of the plurality of NAND strings to prevent data stored in the plurality of memory cells of the NAND string from being programmed.

BRIEF DESCRIPTION OF THE DRAWINGS

Exemplary embodiments of the inventive concept will be more clearly understood from the following detailed description taken in conjunction with the accompanying drawings, in which.

DETAILED DESCRIPTION OF PREFERRED EMBODIMENTS

Figure 1:
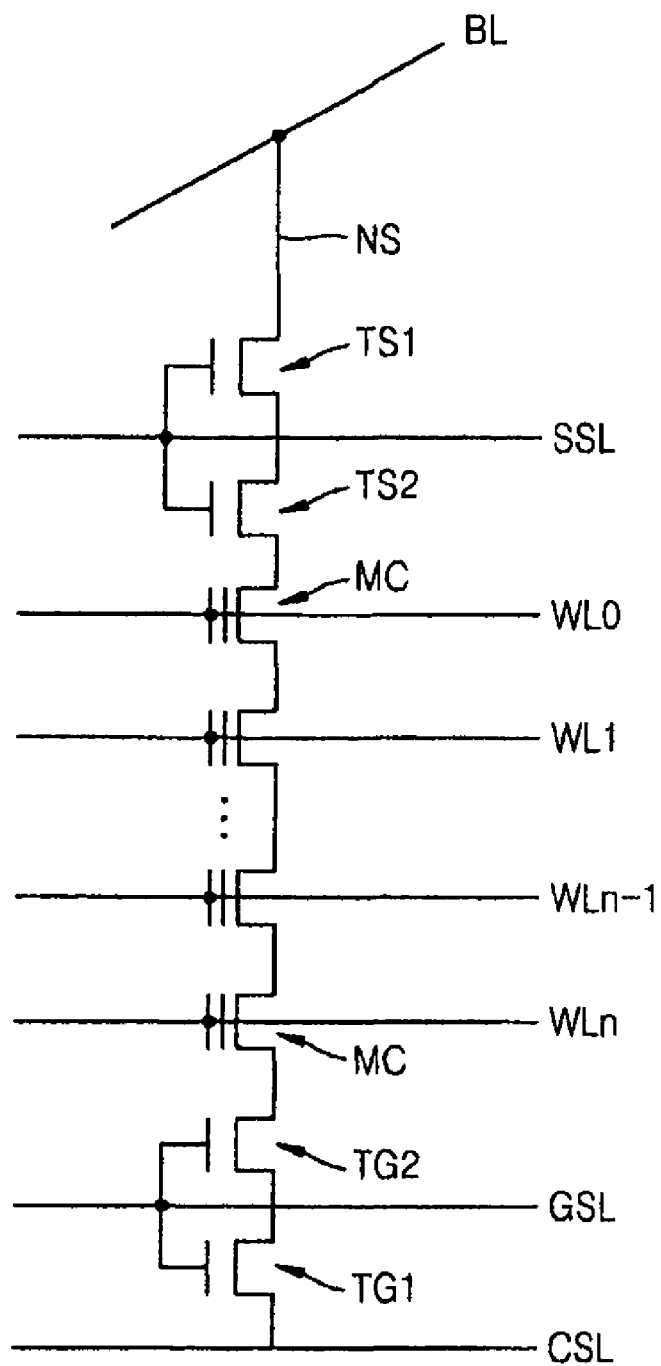
FIG. 1 is an embodiment of a circuit diagram of a non-volatile memory device, according to aspects of the inventive concept.

Hereinafter, exemplary embodiments of the inventive concept will be described more fully with reference to the accompanying drawings. The inventive concept may, however, be embodied in many different forms and should not be construed as being limited to the embodiments set forth herein. Rather, these embodiments are provided so that this disclosure will convey the inventive concept to those of ordinary skill in the art. In the drawings, the size of each element may be exaggerated for clarity.

The terms used in the following embodiments may be understood as being generally known in the technical field to which the inventive concept pertains. For example, the term, 'at least one' includes one or more of the associated listed items and is intended to include not only a singular form but also plural forms.

It will be understood that, although the terms first, second, etc. are be used herein to describe various elements, these elements should not be limited by these terms. These terms are used to distinguish one element from another, but not to imply a required sequence of elements. For example, a first element can be termed a second element, and, similarly, a second element can be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

Spatially relative terms, such as "beneath," "below," "lower," "above," "upper" and the like may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (e.g., rotated 90 degrees or at other orientations) and the spatially relative descriptors used herein interpreted accordingly.

FIG. 1 is an embodiment of a circuit diagram of a non-volatile memory device according to aspects of the inventive concept. Referring to FIG. 1, a NAND string NS may extend in a vertical direction, that is, it may have a vertical structure relative to a substrate (not shown). The NAND string NS may have at least one pair of string selection transistors TS1 and TS2, a plurality of memory cells MC, and at least one pair of ground selection transistors TG1 and TG2. A bit line BL may be connected to one end of the NAND string NS and a common source line CSL may be connected to the other end of the NAND string NS.

The memory cells MC may be arranged in series in the vertical direction. The memory cells MC may store data. A plurality of word lines WL0, WL1, through WLn−1, and WLn, where "n"+1 is the number of word lines, may be respectively coupled to the memory cells MC in order to control the memory cells MC. The total number of the memory cells MC may be appropriately determined according to the capacity of the non-volatile memory device.

The string selection transistors TS1 and TS2 may be arranged near one end of the memory cells MC. For example, the string selection transistors TS1 and TS2 may be located between the bit line BL and the memory cells MC, and may be connected in series to the memory cells MC. The string selection transistors TS1 and TS2 may control an exchange of signals between the bit line BL and the memory cells MC. The string selection line SSL may be commonly coupled to the string selection transistors TS1 and TS2. Thus, the string selection transistors TS1 and TS2 may operate together as if they were unified as one transistor.

The ground selection transistors TG1 and TG2 may be located opposite to the string selection transistors TS1 and TS2, and closer to the other end of the memory cells MC. For example, ground selection transistors TG1, TG2 may be located between the common source line CSL and the memory cells MC, and may be connected in series to the memory cells MC. The ground selection transistors TG1 and TG2 may exchange signals between the common source line CSL and the memory cells MC. The ground selection line GSL may be commonly coupled to the ground selection transistors TG1 and TG2. Thus, the ground selection transistors TG1 and TG2 may operate together as if they were unified as one transistor.

For example, in order to perform a programming operation, 0V may be applied to the bit line BL, an 'ON' voltage (a turn-on voltage) may be applied to the string selection line SSL, and an 'OFF' voltage (turn-off voltage) may be applied to the ground selection line GSL. The 'ON' voltage may be equal to or greater than a threshold voltage of the memory cells MC in order to turn on the string selection transistors TS1 and TS2, and the 'OFF' voltage may be less than the threshold voltage in order to turn off the ground selection transistors TG1 and TG2. A program voltage may be applied to a memory cell MC selected from among the memory cells MC, and a pass voltage may be applied to the other memory cells MC. When the program voltage is applied to the selected memory cell MC, electric charges may be injected into the selected memory cell MC due to Fowler-Nordheim (FN) tunneling. FN tunneling is known in the art, so not discuss in detail herein. The pass voltage may be greater than the threshold voltage.

In order to perform a read operation, a read voltage may be applied to the bit line BL, and the 'ON' voltage may be applied to the string selection line SSL and the ground selection line GSL. A reference voltage may be applied to a memory cell MC selected from among the memory cells MC, and the pass voltage may be applied to the other memory cells.

In order to perform an erase operation, an erase voltage may be applied to the bodies of the memory cells MC, and 0V may be applied to the word lines WL0, WL1 through WLn−1, and WLn. Thus, data may be erased from the memory cells MC at the same time.

Alternatively, one of either the string selection transistors TS1 and TS2 or the ground selection transistors TG1 and TG2 may be omitted. The string selection transistors TS1 and TS2 and the ground selection transistors TG1 and TG2 may be respectively referred to as first selection transistors and second selection transistors and vice versa.

Figure 2:
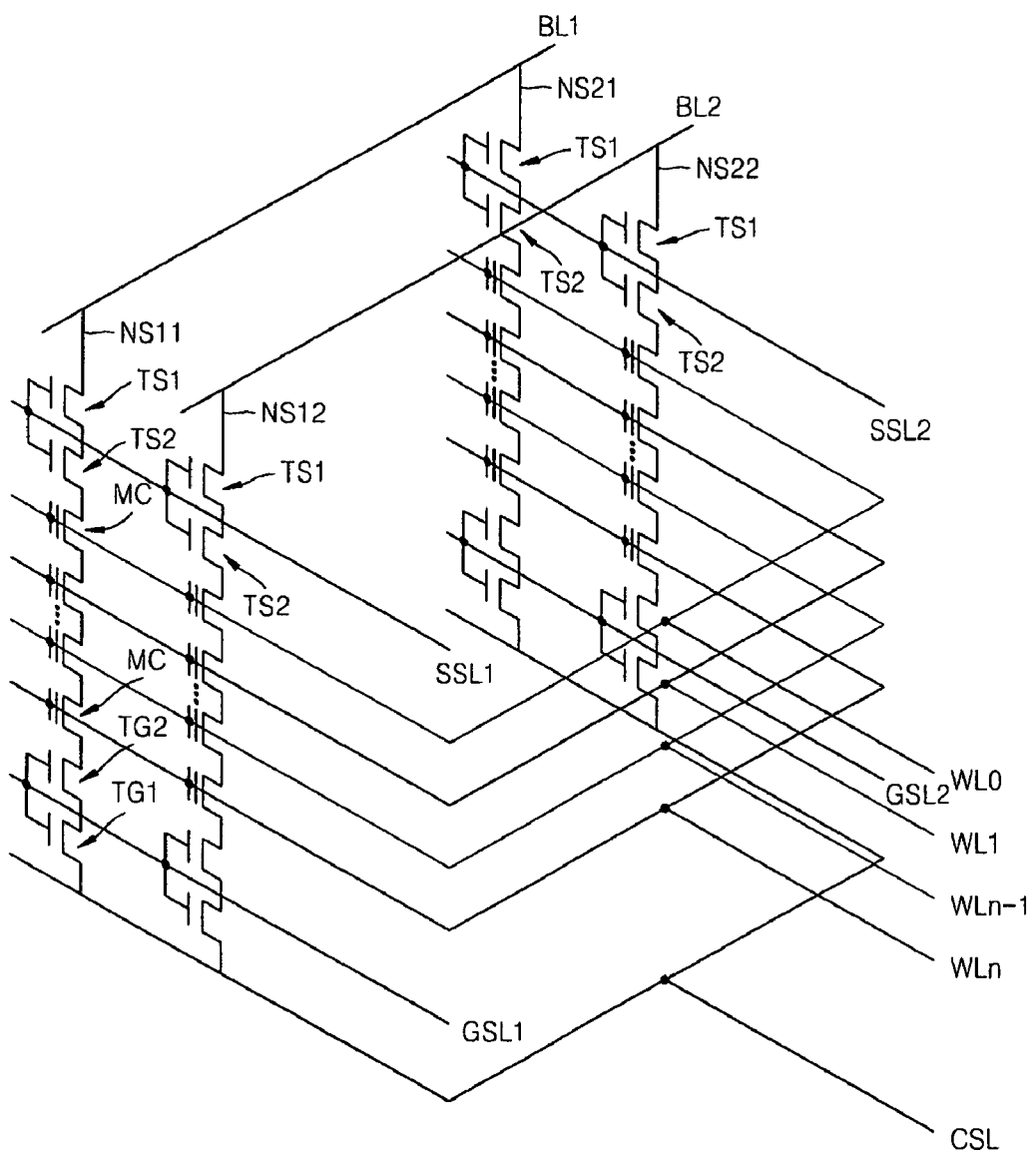
FIG. 2 is another embodiment of a circuit diagram of a non-volatile memory device, according to aspects of the inventive concept.

FIG. 2 is another embodiment of a circuit diagram of a non-volatile memory device according to aspects of the inventive concept. The non-volatile memory device of FIG. 2 may correspond to an array of a plurality of non-volatile memory devices, such as that shown in FIG. 1. Thus, a description of the operations or characteristics of elements that are the same as those of FIG. 1 will not be provided here.

Referring to FIG. 2, a plurality of NAND strings NS11, NS12, NS21, and NS22, each having a vertical structure, may be arranged in a matrix. A first bit line BL1 may be commonly connected to the NAND strings NS11 and NS21 in a first row, and a second bit line BL2 may be commonly connected to the NAND strings NS12 and NS22 in a second row. A common source line CSL may be commonly connected to be opposite to the first and second bit lines BL1 and BL2 and may be commonly connected to the other ends of the NAND strings NS11, NS12, NS21, and NS22. The total number of the NAND strings NS11, NS12, NS21, and NS22 and the total number of the bit lines BL1 and BL2 are just examples thereof, and the inventive concept is not limited thereto.

Word lines WL0, WL1 through WLn−1, and WLn may be commonly connected to memory cells MC arranged at the same level. A first string selection line SSL1 may be commonly coupled to string selection transistors TS1 and TS2 of the NAND strings NS11 and NS12 in the first row. A second string selection line SSL2 may be commonly coupled to string selection transistors TS1 and TS2 of the NAND strings NS21 and NS22 in the second row. A first ground selection line GSL1 may be commonly coupled to ground selection transistors TG1 and TG2 of the NAND strings NS11 and NS12 in the first row. A second ground selection line GSL2 may be commonly coupled to ground selection transistors TG1, and TG2 of the NAND strings NS21 and NS22 in the second row.

In order to perform a program operation, 0V may be applied to a bit line selected from the bit lines BL1 and BL2, and an 'ON' voltage may be applied to the other bit line BL1 or BL2 for channel boosting. Also, the 'ON' voltage may be applied to a string selection line selected from the string selection lines SSL1 and SSL2 and an 'OFF' voltage may be applied to the other string selection line SSL1 or SSL2. Thus, it is possible to selectively operate a NAND string that is commonly connected to the selected bit line and string selection line from among the NAND strings NS11, NS12, NS21, and NS22.

In order to perform a read operation, a read voltage may be applied to a bit line selected from the bit lines BL1 and BL2 and the other bit line BL1 or BL2 may be floated. Also, the 'ON' voltage may be applied to a string selection line selected from string selection lines SSL1 and SSL2 and the 'OFF' voltage may be applied to the other string selection line SSL1 or SSL2. Thus, it is possible to selectively operate a NAND string that is commonly connected to the selected bit line and string selection line from among NAND strings NS11, NS12, NS21, and NS22.

In order to perform an erase operation, an erase voltage may be applied to the bodies of the memory cells MC and 0V may be applied to the word lines WL0, WL1 through WLn−1, and WLn. Accordingly, data may be erased from the memory cells MC of the NAND strings NS11, NS12, NS21, and NS22 at the same time.

Figure 3:
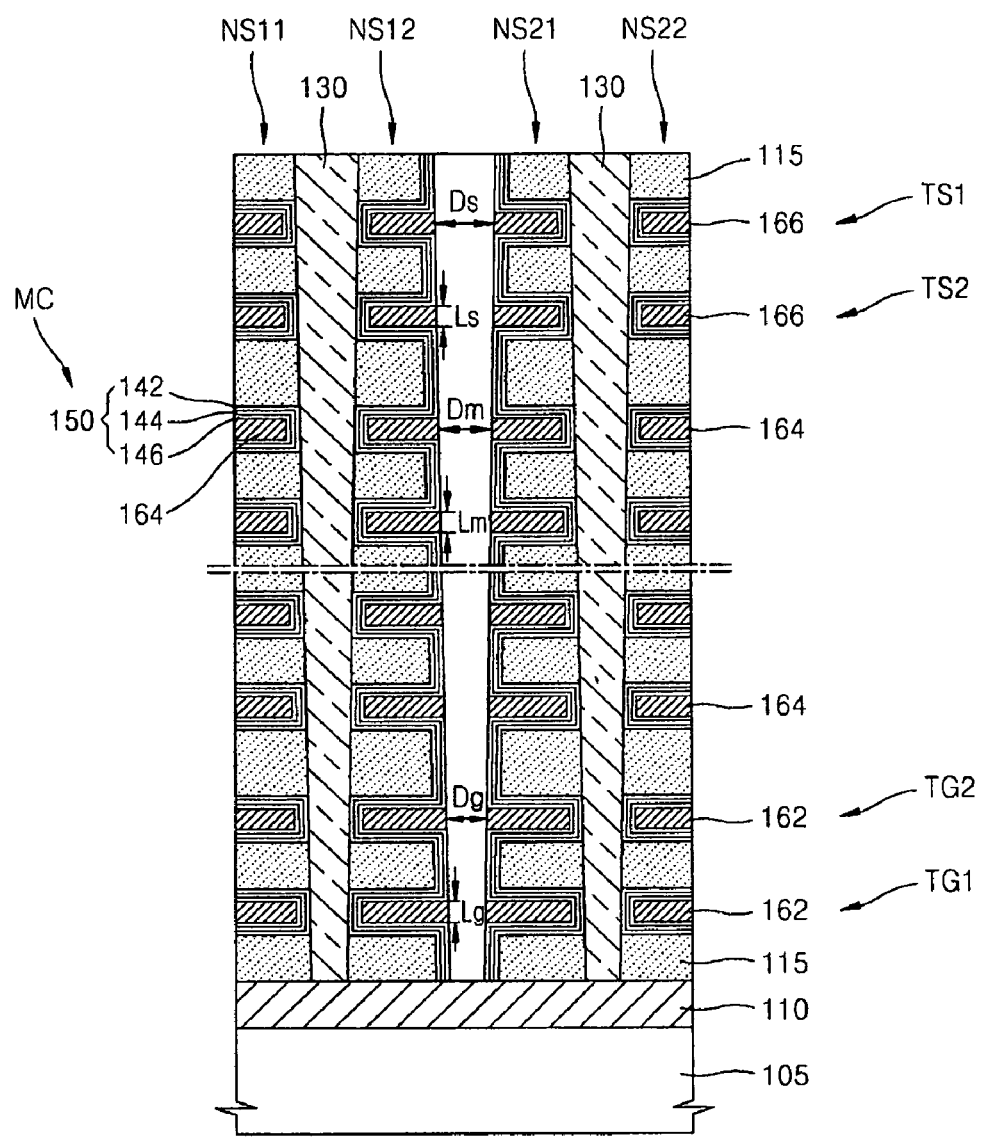
FIG. 3 is a schematic cross-sectional view of the non-volatile memory device of FIG. 2, taken from a direction of word lines.
Figure 4:
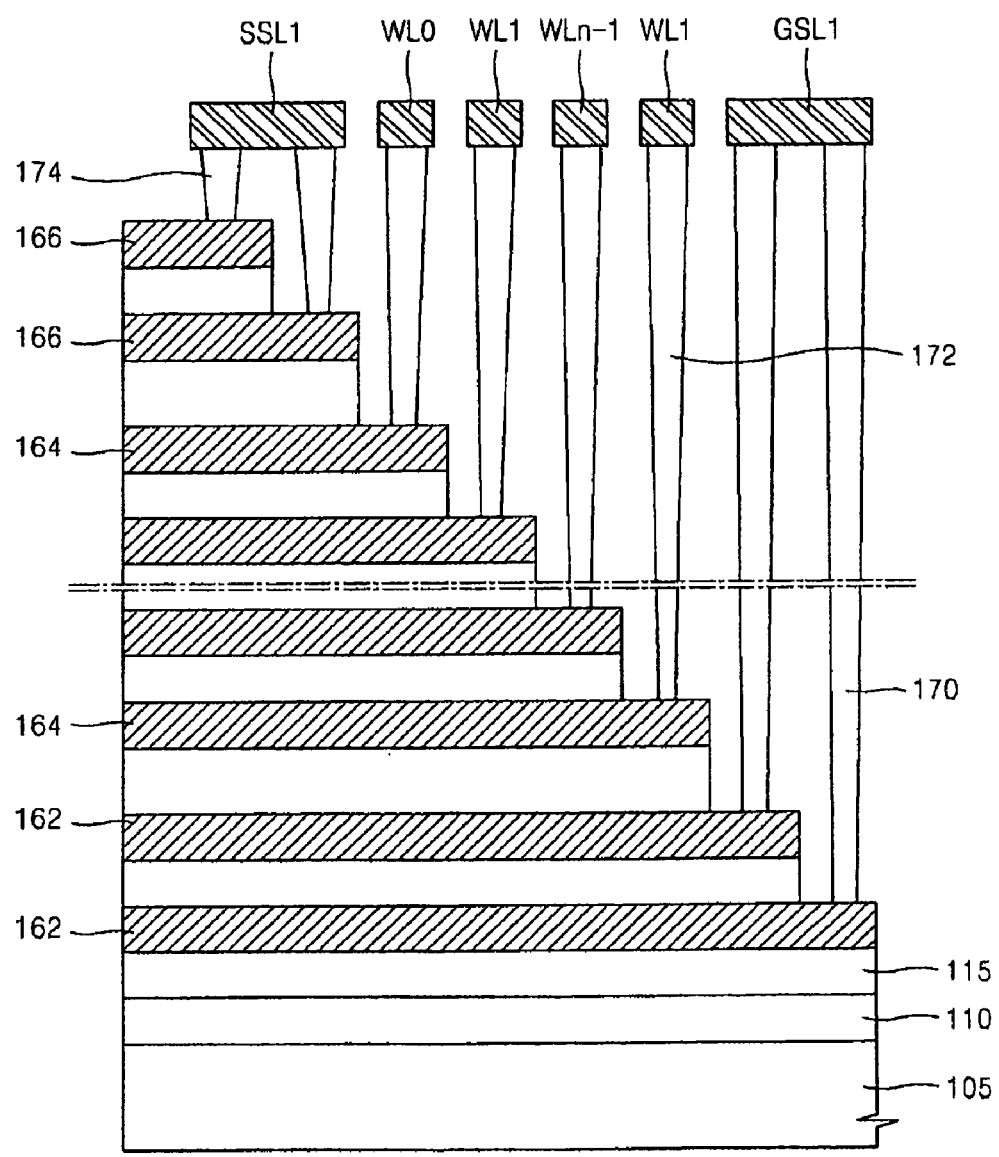
FIG. 4 is a schematic cross-sectional view of the non-volatile memory device of FIG. 2, taken from a direction of bit lines.

FIG. 3 is a schematic cross-sectional view of the non-volatile memory device of FIG. 2, taken from a direction of word lines. FIG. 4 is a schematic cross-sectional view of the non-volatile memory device of FIG. 2, taken from a direction of bit lines.

Referring to FIGS. 2 to 4, a substrate 105 may be provided and prepared. The substrate 105 may be formed of a semiconductor material, e.g., a IV semiconductor, a III-V compound semiconductor, or a II-VI oxide semiconductor. For example, the IV semiconductor may include silicon, germanium, or silicon-germanium. In various embodiments, the substrate 105 may be a bulk wafer or an epitaxial layer.

A plurality of semiconductor poles 130 may be formed to extend upwardly from the substrate 105, here semiconductor poles 130 extend vertically from the substrate 105. The NAND strings NS11, NS12, NS21, and NS22 may be formed along and on the sidewalls of the semiconductor poles 130. The substrate 105 may include an impurity-doped region 110 below the semiconductor poles 130. The impurity-doped region 110 may be a source region and may form a PN junction together with another region of the substrate 105. The common source line CSL of FIG. 2 may be connected to the impurity-doped region 110.

Alternatively, a plurality of source regions may be formed only at the bottoms of the semiconductor poles 130, and the impurity-doped region 110 may function as the common source line CSL. A plurality of drain regions may be formed only at the tops of the semiconductor poles 130 and may be connected to the bit line BL1 of FIG. 2.

The memory cells MC may include a plurality of storage media 150 on the sidewalls of the semiconductor poles 130, and a plurality of control gate electrodes 164 on the storage media 150. Each of the storage media 150 may include a tunneling insulating layer 142 at least partially formed on a sidewall of one of the semiconductor poles 130, a charge storing layer 144 formed on the tunneling insulating layer 142, and a blocking insulating layer 146 formed on the charge storing layer 144, and around the control gate electrode.

A PN junction source/drain region doped with impurities is not formed around the surfaces of the semiconductor poles 130 between the control gate electrodes 164. Thus, the semiconductor poles 130 in the memory cells MC may be continuously doped with impurities of the same conductive type in order to form a well or a channel. In this case, the semiconductor poles 130 between the memory cells MC may be electrically connected using a field effect source/drain region during a program/read operation. The surfaces of the semiconductor poles 130 between the memory cells MC may be turned on using an electric field, i.e., a fringing field, which is formed in the lateral direction of the control gate electrodes 164.

The charge storing layers 144 may have charge storing capabilities. The charge storing layers 144 may be charge trapping layers, and may include, for example, a silicon nitride layer, quantum dots, or nanocrystals. The quantum dots or nanocrystals may be formed of a conductive material, e.g., fine metal or semiconductor particles. Each of the tunneling insulating layers 142 and the blocking insulating layers 146 may include an oxide layer, a nitride layer, or a high-K layer. The high-K layer may be a dielectric layer, the dielectric constant of which is greater than those of an oxide layer and a nitride layer.

The string selection transistors TS1 and TS2 may include a plurality of string selection gate electrodes 166 on the sidewalls of the semiconductor poles 130. The ground selection transistors TG1 and TG2 may include a plurality of ground selection gate electrodes 162 on the sidewalls of the semiconductor poles 130. The string selection gate electrodes 166 and the ground selection gate electrodes 162 may be respectively referred to as first selection gate electrodes and second selection gate electrodes and vice versa.

A PN junction source/drain region doped with impurities is not formed around the surfaces of the semiconductor poles 130 between the memory cells MC, and also is not formed among the string selection transistors TS1 and TS2, the memory cells MC, and the ground selection transistors TG1 and TG2. Instead, the semiconductor poles 130 between the memory cells MC may be electrically connected using the field effect source/drain region during a program/read operation, as described above.

The storage media 150 between the string selection transistors TS1 and TS2 and the semiconductor poles 130 and between the ground selection transistors TG1 and TG2 and the semiconductor poles 130 may function as gate insulating layers and may be thus replaced with one insulating layer in some embodiments. A plurality of interlevel dielectric layers 115 may be formed among the ground selection gate electrodes 162, the control gate electrodes 164, and the string selection gate electrodes 166. The storage media 150 may extend along the surfaces of the interlevel dielectric layers 115.

The string selection gate electrodes 166 may be commonly connected to the first string selection line SSL1 via contact plugs 174. The control gate electrodes 164 may be respectively connected to the word lines WL0, WL1, through WLn–1, and WLn via contact plugs 172. The ground selection gate electrodes 162 may be connected to the first ground selection line GSL1 via contact plugs 170.

In the present embodiment, at least two string selection transistors, i.e., the string selection transistors TS1 and TS2, are used. Thus, since the gate lengths of the string selection gate electrodes 166 may be still less than when only one string selection transistor is used, a gap between the interlevel dielectric layers 115 may be filled with the string selection gate electrode 166 without causing a void. Furthermore, at least two ground selection transistors, i.e., the ground selection transistors TG1 and TG2, are used. Thus, since the gate lengths of the ground selection gate electrodes 162 may still be less than when only one ground selection transistor is used, a gap between the interlevel dielectric layers 115 may be filled with the ground selection gate electrode 164 without causing a void.

The gate length Ls of the string selection gate electrodes 166 may be less than or equal to the distance Ds between the string selection gate electrodes 166 that face each other between adjacent semiconductor poles 130. The gate length Lm of the control gate electrodes 164 may be less than or equal to the distance Dm between the control gate electrodes 164 that face each other between adjacent semiconductor poles 130. The gate length Lg of the ground selection gate electrodes 162 may be less than or equal to the distance Dg between the ground selection gate electrodes 162 that face each other between adjacent semiconductor poles 130.

The difference between the gate length Ls of the string selection gate electrodes 166, the gate length Lm of the control gate electrodes 164, and the gate length Lg of the ground selection gate electrodes 162 may be in a range of about 0 nm to 10 nm.

Accordingly, the gaps between the interlevel dielectric layers 115 in a NAND string (NS) may be filled with the string selection gate electrodes 166, the control gate electrodes 164, and/or the ground selection gate electrodes 162 without causing a void, thereby increasing the control reliability of the string selection gate electrodes 166, the control gate electrodes 164, and/or the ground selection gate electrodes 162.

Figure 5:
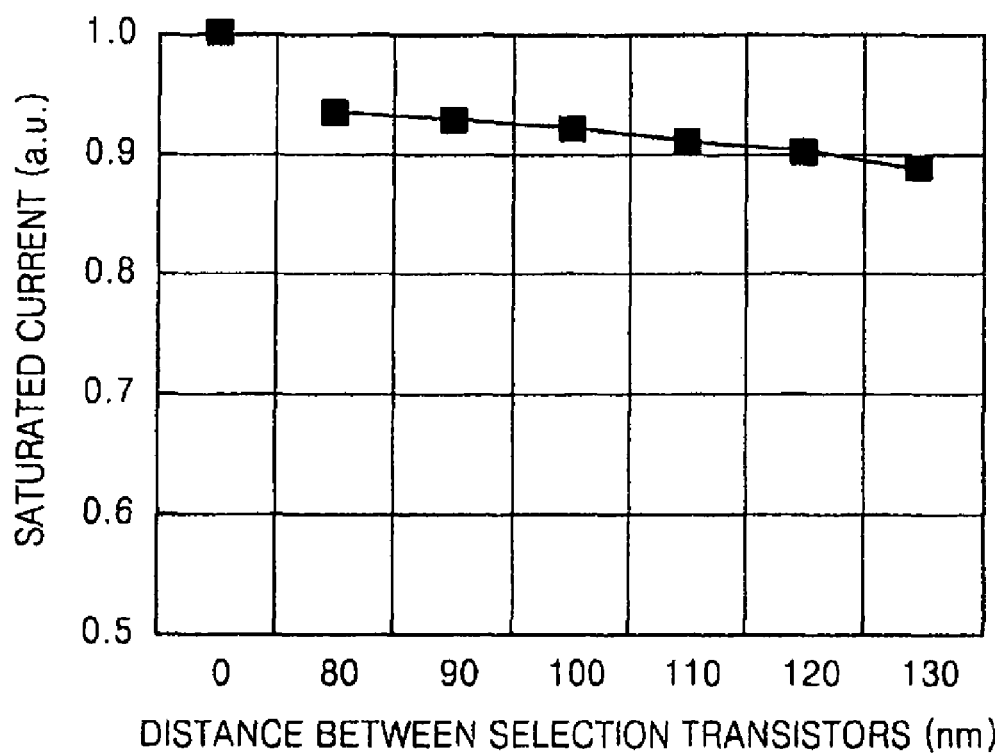
FIG. 5 is a graph showing the result of an experiment in which a saturated current flowing through selection transistors was measured according to the distance between the selection transistors, according to an embodiment of the inventive concept.

FIG. 5 is a graph showing the result of an experiment in which a saturated current flowing through selection transistors was measured according to the distance between the selection transistors, according to aspects of the inventive concept. The experiment of FIG. 5 shows that the greater the distance between the selection transistors, the less the saturated current flowing through the selection transistors. However, the saturated current was not greatly changed. When the distance between the selection transistors was 0 nm, it means that the selection transistors were formed in a single body. When the distance between the selection transistors was about 130 nm, the saturated current was reduced by about less than 10% than the saturated current from when the distance between the selection transistors was 0 nm. The reason why the saturated current was not greatly changed even when the selection transistors were separated from each other is that no PN junction source/drain region is present between the string selection transistors. However, when the distance between the string selection transistors increases, the intensity of a fringing field may be weakened, thus gradually reducing the saturated current.

Figure 6:
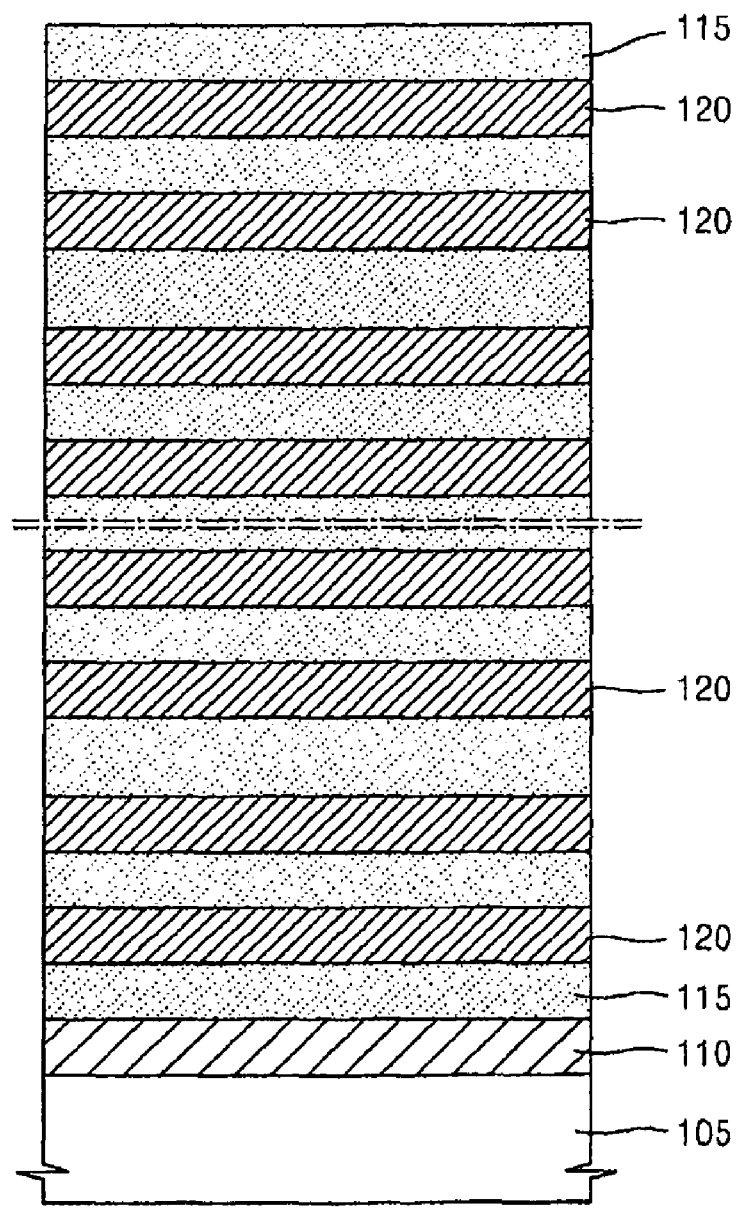
FIGS. 6 through 12 are schematic cross-sectional views illustrating an embodiment of a method of fabricating a non-volatile memory device, according to aspects of the inventive concept.

FIGS. 6 through 12 are schematic cross-sectional views illustrating an embodiment of a method of fabricating a non-volatile memory device according to aspects of the inventive concept. Referring to FIG. 6, an impurity-doped region 110 may be defined by implanting impurities into an upper part of a substrate 105. Next, interlevel dielectric layers 115 and sacrificial layers 120 may be alternately formed on the substrate 105. The sacrificial layers 120 may be etched selectivity with respect to the interlevel dielectric layers 115. For example, interlevel dielectric layers 115 may be oxide layers and the sacrificial layers 120 may be nitride layers.

Figure 7:
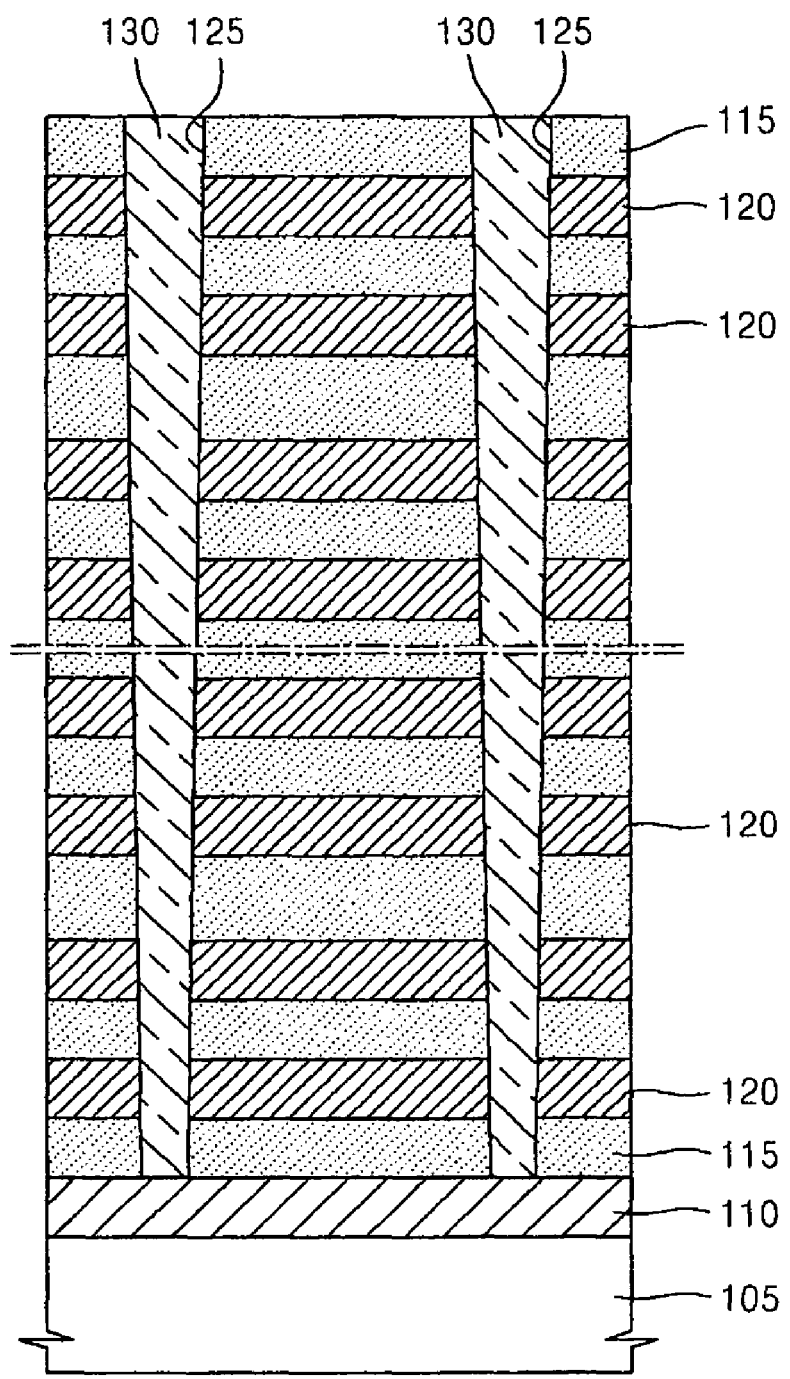

Referring to FIG. 7, a plurality of first holes 125 may be formed by etching the interlevel dielectric layers 115 and the sacrificial layers 120. The first holes 125 may be formed using photolithography and etching processes, as examples. Next, a plurality of semiconductor poles 130 may be formed to fill in the holes 125. For example, the semiconductor poles 130 may be epitaxial layers having a polycrystalline or monocrystalline structure.

Figure 8:
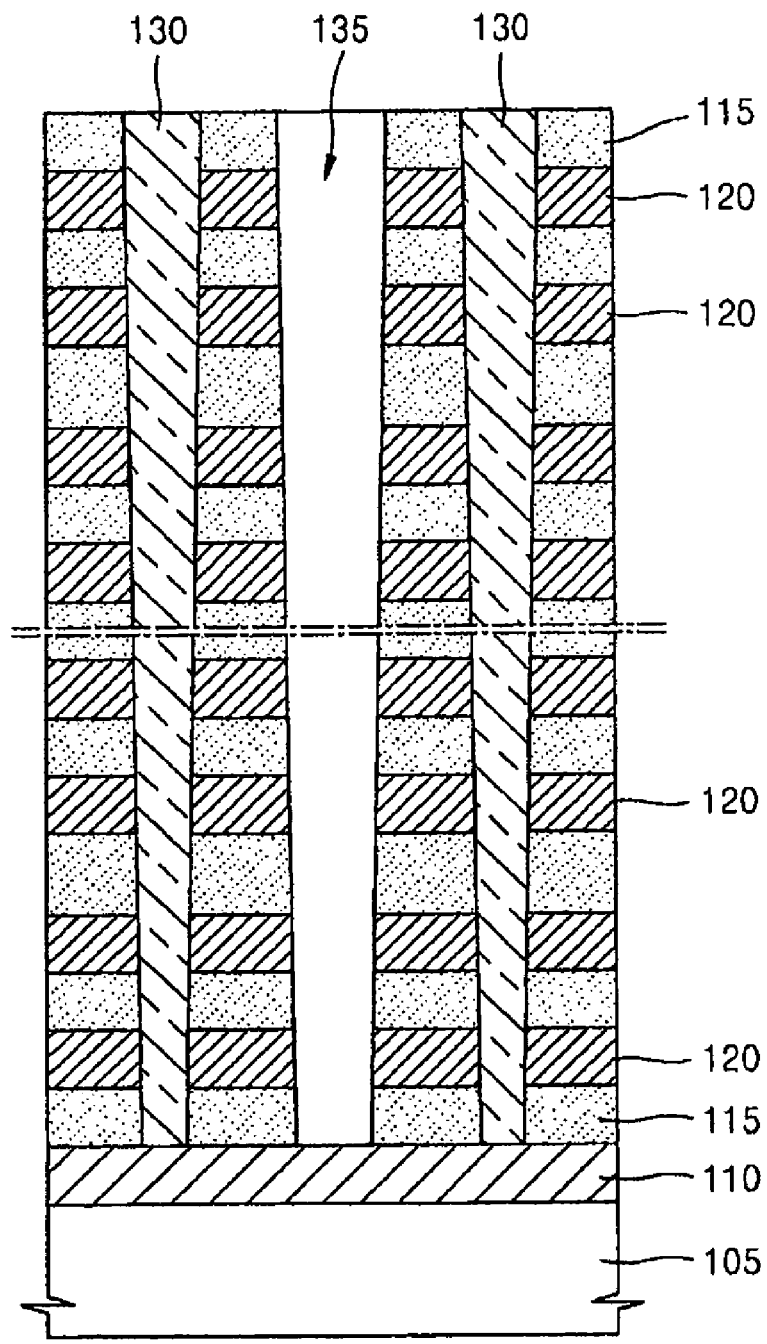

Referring to FIG. 8, a plurality of second holes 135 may be formed by etching the interlevel dielectric layers 115 and the sacrificial layers 120 between the semiconductor poles 130. The second holes 135 may be obtained using the photolithography and etching processes. Within the partial view of FIG. 8, only one second hole 135 is shown.

Figure 9:
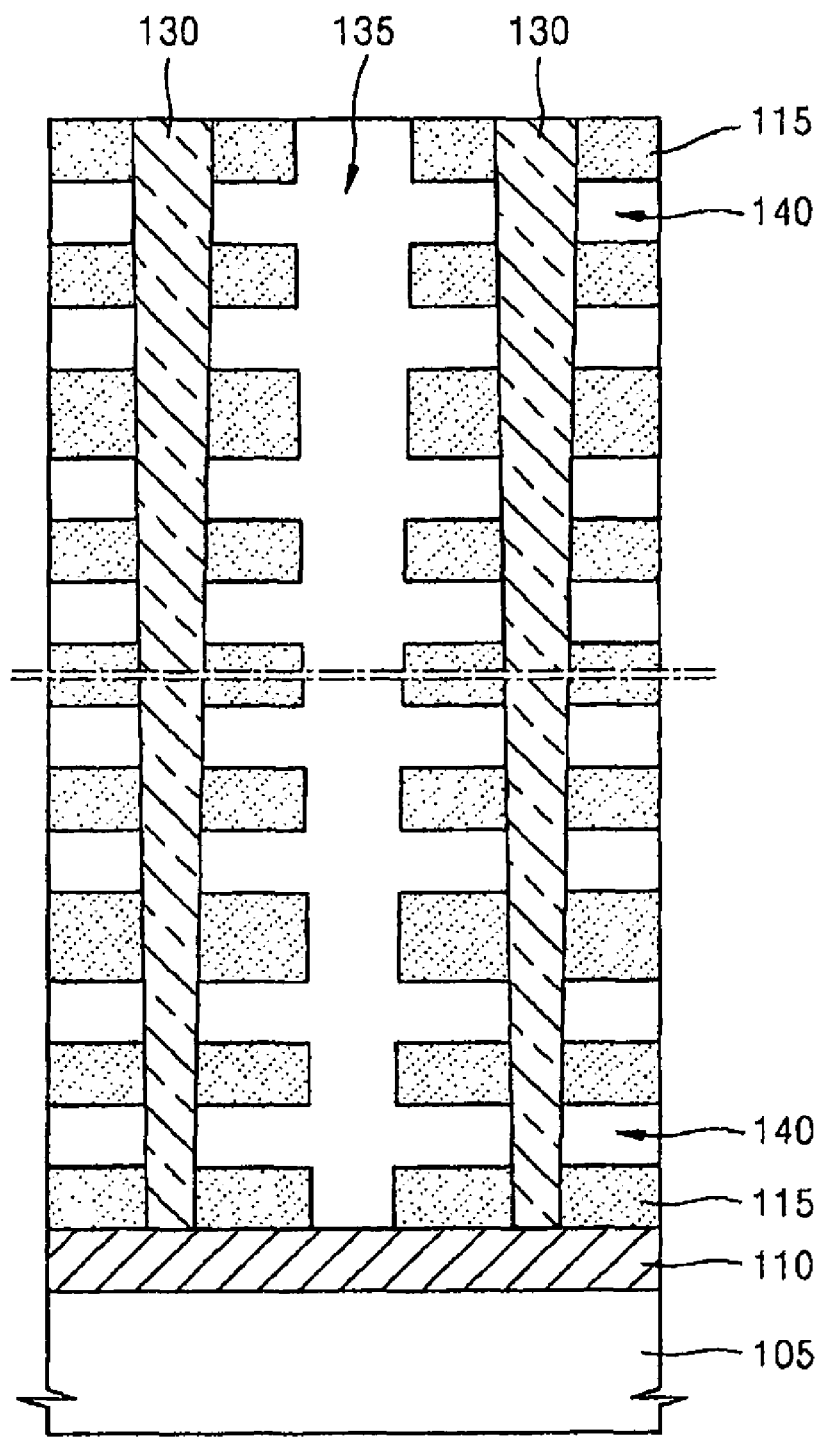

Referring to FIG. 9, the sacrificial layers 120 may be removed. For example, the sacrificial layers 120 may be removed by permeating an etchant between the interlevel dielectric layers 115 via the second holes 135 using isotropic etching. For example, isotropic etching may include wet etching or chemical dry etching, as examples. Thus, the sacrificial layers 120 between the interlevel dielectric layers 115 may be removed to form a plurality of tunnels 140 connected to the second holes 135. The tunnels 140 may expose portions of the sidewalls of the semiconductor poles 130.

Figure 10:
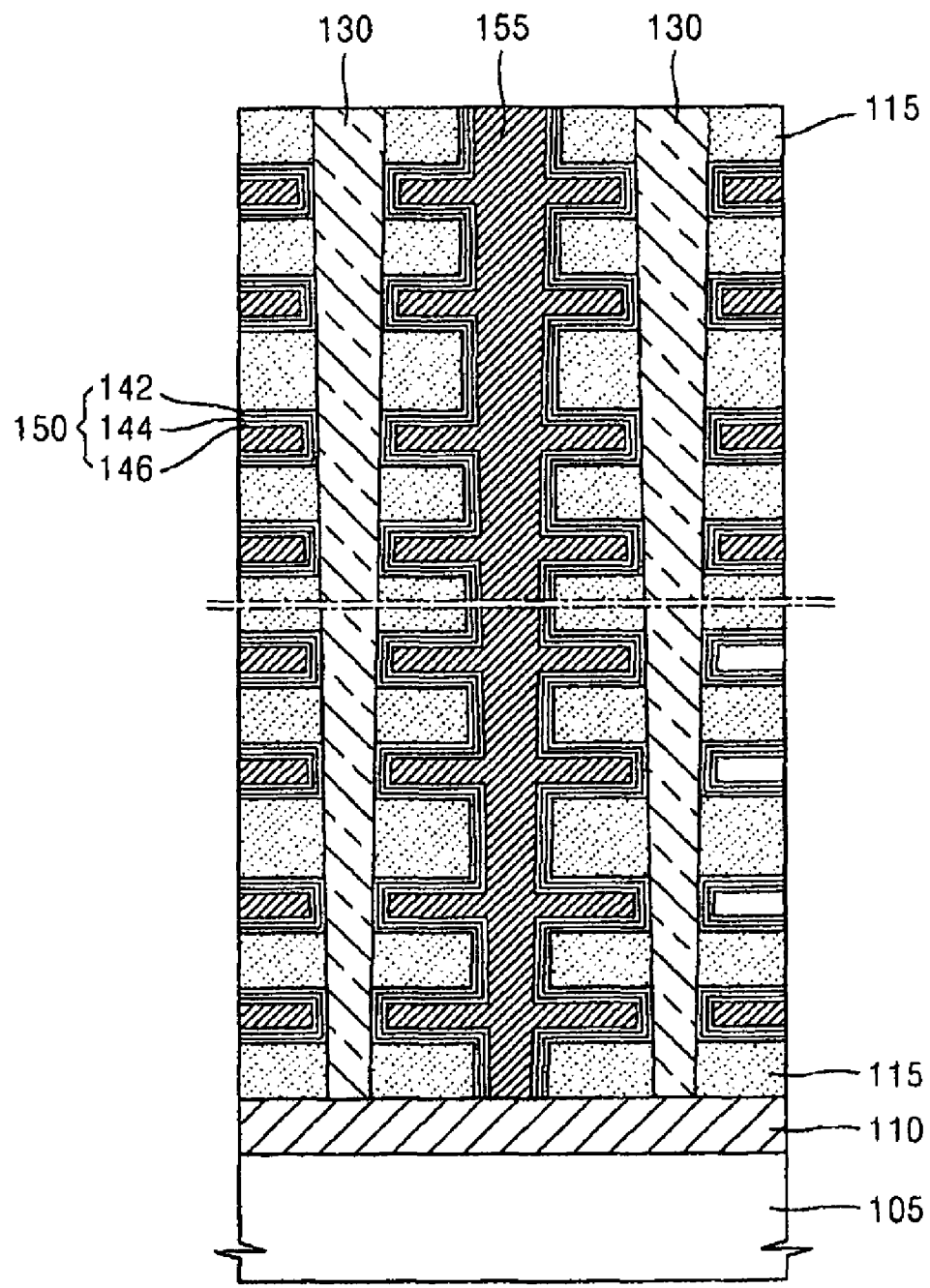

Referring to FIG. 10, a plurality of storage media 150 may be formed on the sidewalls of the interlevel dielectric layers 115 and the semiconductor poles 130, which are exposed via the second holes 135 of FIG. 9 and the tunnels 140 of FIG. 9. The storage media 150 may be obtained by sequentially forming a tunneling insulating layer 142, a charge storing layer 144, and a blocking insulating layer 146. Next, a conductive layer 155 may be formed on the storage media 150. For example, the storage media 150 and the conductive layer 155 may be obtained using chemical vapor deposition or an electroplating method having good step coverage.

A reactive source for forming the conductive layer 155 may be supplied in a direction from the top of the second holes 135 to the bottom thereof. Thus, in order to form the conductive layer 155 in the tunnels 140 of FIG. 4 without causing a void, the second holes 135 should not be blocked before the tunnels 140 are filled with the conductive layer 155. This condition may be primarily satisfied by forming at least two separated string selection transistors, i.e., the string selection transistors TS1 and TS2, and at least two separated ground selection transistors, i.e., the ground selection transistors TG1 and TG2, as described above with reference to FIG. 3. It is possible to control the gate lengths of a string selection gate electrode 166, a control gate electrode 164, and a ground selection gate electrode 166 illustrated in FIG. 11 by controlling the widths of the second holes 135 and the tunnels 140 as described above with reference to FIG. 3.

Figure 11:
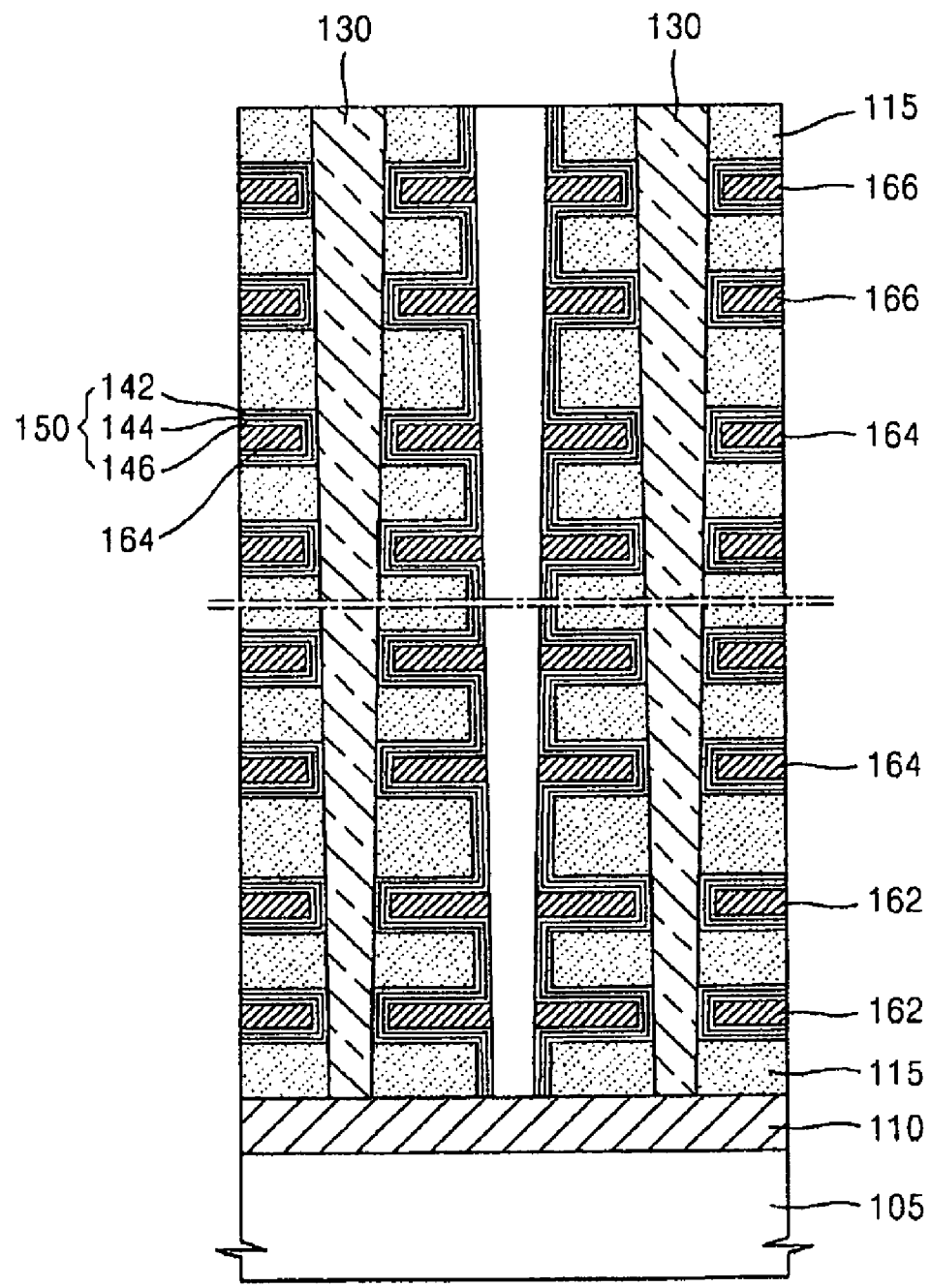

Referring to FIG. 11, the conductive layer 155 of FIG. 10 that is exposed via the second holes 135 may be selectively etched in order to form the ground selection gate electrodes 162, the control gate electrodes 164, and the string selection gate electrodes 166.

Figure 12:
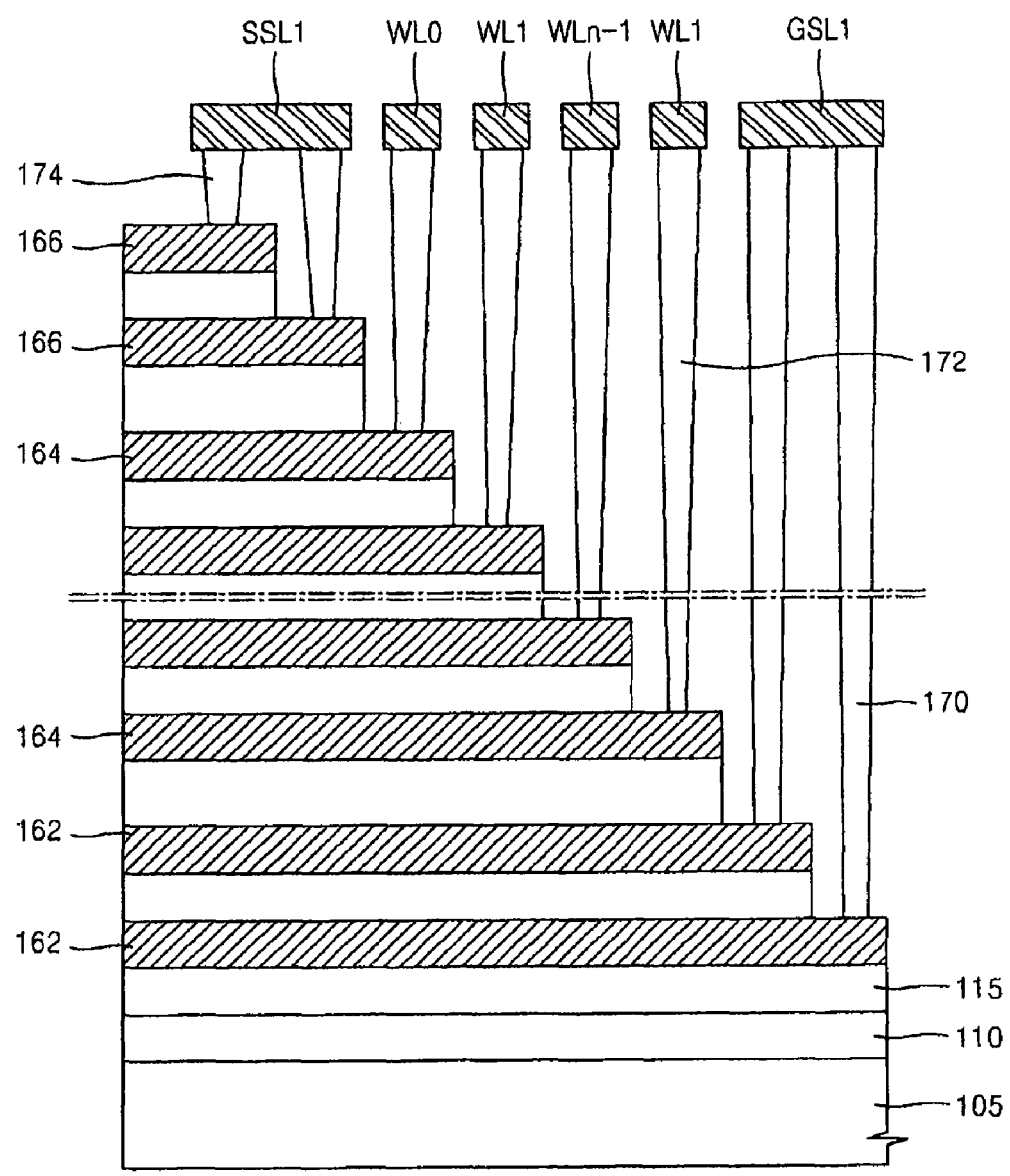

Referring to FIG. 12, the string selection gate electrodes 166 may be commonly connected to a first string selection line SSL1 via contact plugs 174. The control gate electrodes 164 may be connected to word lines WL0, WL1, through WLn−1, and WLn via contact plugs 172. The ground selection gate electrodes 162 may be connected to a first ground selection line GSL1 via contact plugs 170.

Figure 13:
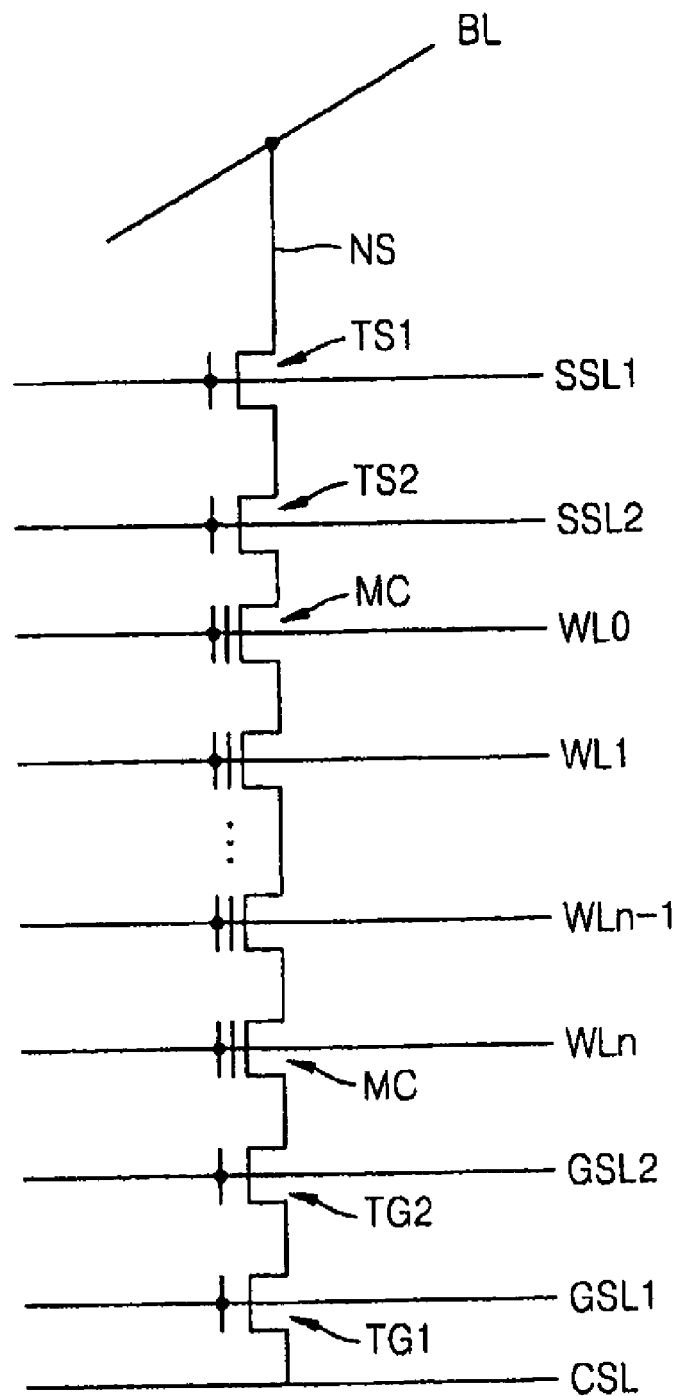
FIG. 13 is another embodiment of a circuit diagram of a non-volatile memory device, according to aspects of the inventive concept.
Figure 14:
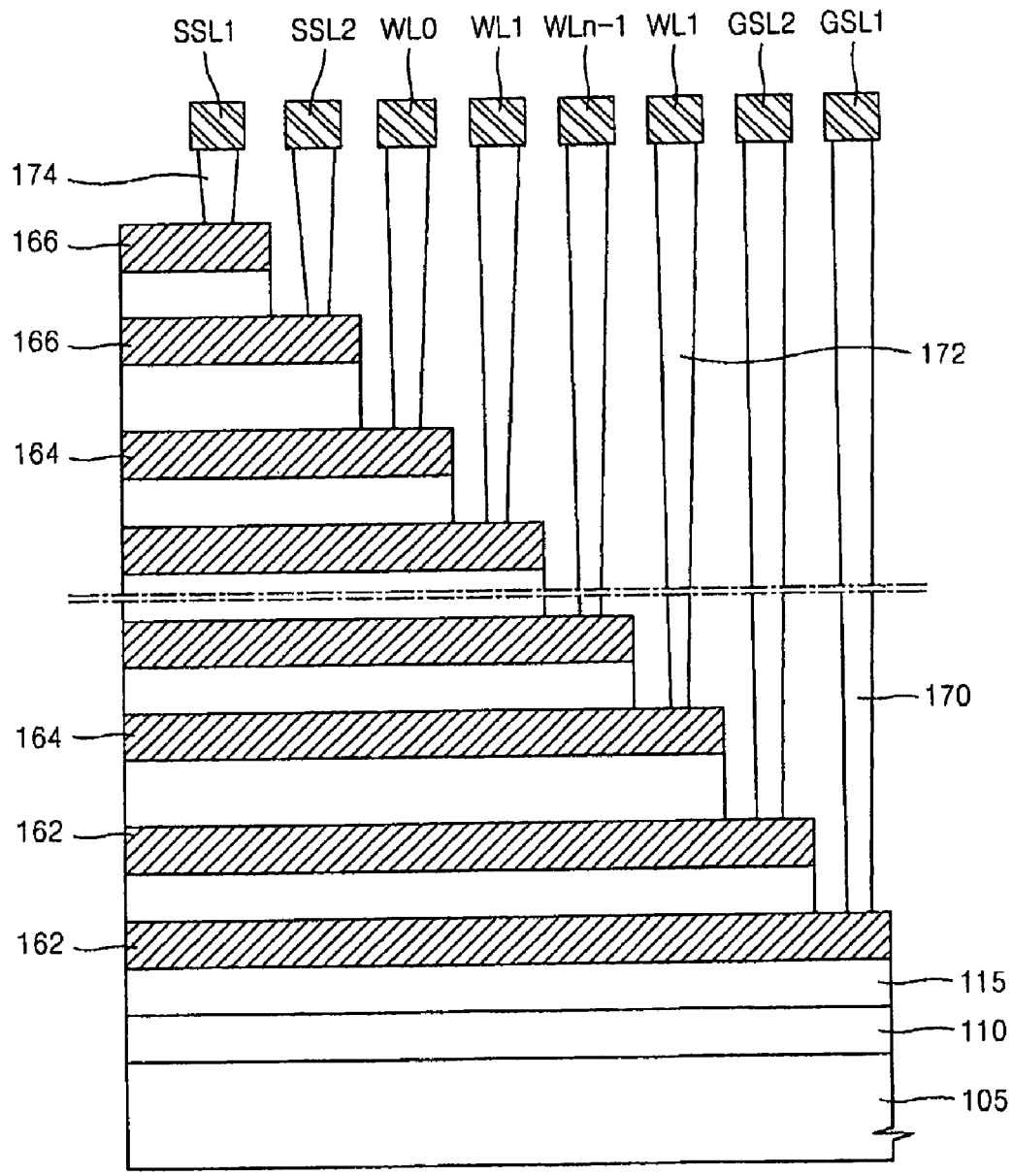
FIG. 14 is a schematic cross-sectional view of the non-volatile memory device of FIG. 13, taken from a direction of bit lines.

FIG. 13 is an embodiment of a circuit diagram of a non-volatile memory device according to another aspect of the inventive concept. FIG. 14 is a schematic cross-sectional view of the non-volatile memory device of FIG. 13, taken from a direction of bit lines. The non-volatile memory device illustrated in FIGS. 13 and 14 is a modified example of the non-volatile memory devices illustrated in FIGS. 1 to 4, according to aspects of the inventive concept. Thus, the operations or characteristics of constitutional elements that are the same as those of FIGS. 1 to 4 will not be described again here.

Referring to FIG. 13, at least one pair of first and second string selection transistors TS1 and TS2 may be arranged adjacent to a first end of a plurality of memory cells MC. A first string selection line SSL1 may be coupled to the first string selection transistors TS1, and a second string selection line SSL2 may be coupled to the second string selection transistors TS2. Thus, unlike the non-volatile memory device illustrated in FIG. 1, the first and second selection transistors TS1 and TS2 may be disposed apart from each other and may operate individually in this embodiment.

At least one pair of first and second ground selection transistors TG1 and TG2 may be arranged adjacent to a second end of the plurality of memory cells MC, where the second end is opposite to the first end. A first ground selection line GSL1 may be coupled to the first ground selection transistors TG1 and a second ground selection line GSL2 may be coupled to the second ground selection transistors TG2. Thus, unlike the non-volatile memory device illustrated in FIG. 1, the first and second ground selection transistors TG1 and TG2 may be disposed apart from each other and may operate individually. In a modified example of the current embodiment, the first and second ground selection transistors TG1 and TG2 may be connected commonly to one ground selection line GSL, as illustrated in FIG. 1.

An embodiment of a method of operating a non-volatile memory device according to aspects of the inventive concept will now be described with reference to FIG. 13.

For example, for a program operation of the non-volatile memory device, 0V or an operational voltage may be applied to a bit line BL, and 0V may be applied to a common source line CSL. When 0V is applied to the bit line BL, a NAND string NS is selected to be programmed, but when an operational voltage is applied to the bit line BL, the NAND string NS is prevented from being programmed due to channel boosting.

A program voltage may be applied to a memory cell MC selected from among the plurality of memory cells MC in the NAND string and a pass voltage may be applied to the remaining memory cells MC in the NAND string. The pass voltage may be less than the program voltage and be greater than a threshold voltage of the plurality of memory cells MC. The program voltage may be determined such that electric charges are injected into the plurality of memory cells MC by F-N tunneling.

An 'OFF' voltage may be applied to the first and second ground selection lines GSL1 and GSL2 of the NAND string. A first voltage may be applied to the second string selection line SSL2 closest to the plurality of memory cells MC and a second voltage may be applied to the first string selection line SSL2 closest to the bit line BL. The second voltage may be determined to be as low as possible in order to turn on the first string selection transistor TS1 while reducing the 'OFF' current thereof. For example, the second voltage may be equal to or greater than a threshold voltage of the first string selection transistor TS1. That is, the second voltage may be equal to, for example, the operation voltage.

The first voltage may be determined such that the difference between voltages of the second string selection transistor TS2 and a memory cell MC adjacent to the second string selection transistor TS2 is minimized. For example, the first voltage may be substantially equal to the pass voltage. As described above, the first voltage may be determined to be greater than the second voltage and to minimize the difference between the first voltage and the pass voltage, thereby preventing channel boosting efficiency from decreasing due to a leakage current flowing through the second string selection transistor TS2 adjacent to the plurality of memory cells MC.

Accordingly, in the method of operating a non-volatile memory device according to the current embodiment, the first and second string selection transistors TS1 and TS2 are disposed apart from each other and operate individually, and thus, both an 'OFF' current and a leakage current can be reduced.

Referring to FIG. 14, a plurality of string selection gate electrodes 166 may be connected to the first and second string selection line SSL1 and SSL2 via a plurality of contact plugs 174, respectively. A plurality of ground selection gate electrodes 162 may be connected to the first and second ground selection lines GSL1 and GSL2 through a plurality of contact plugs 170, respectively.

Figure 15:
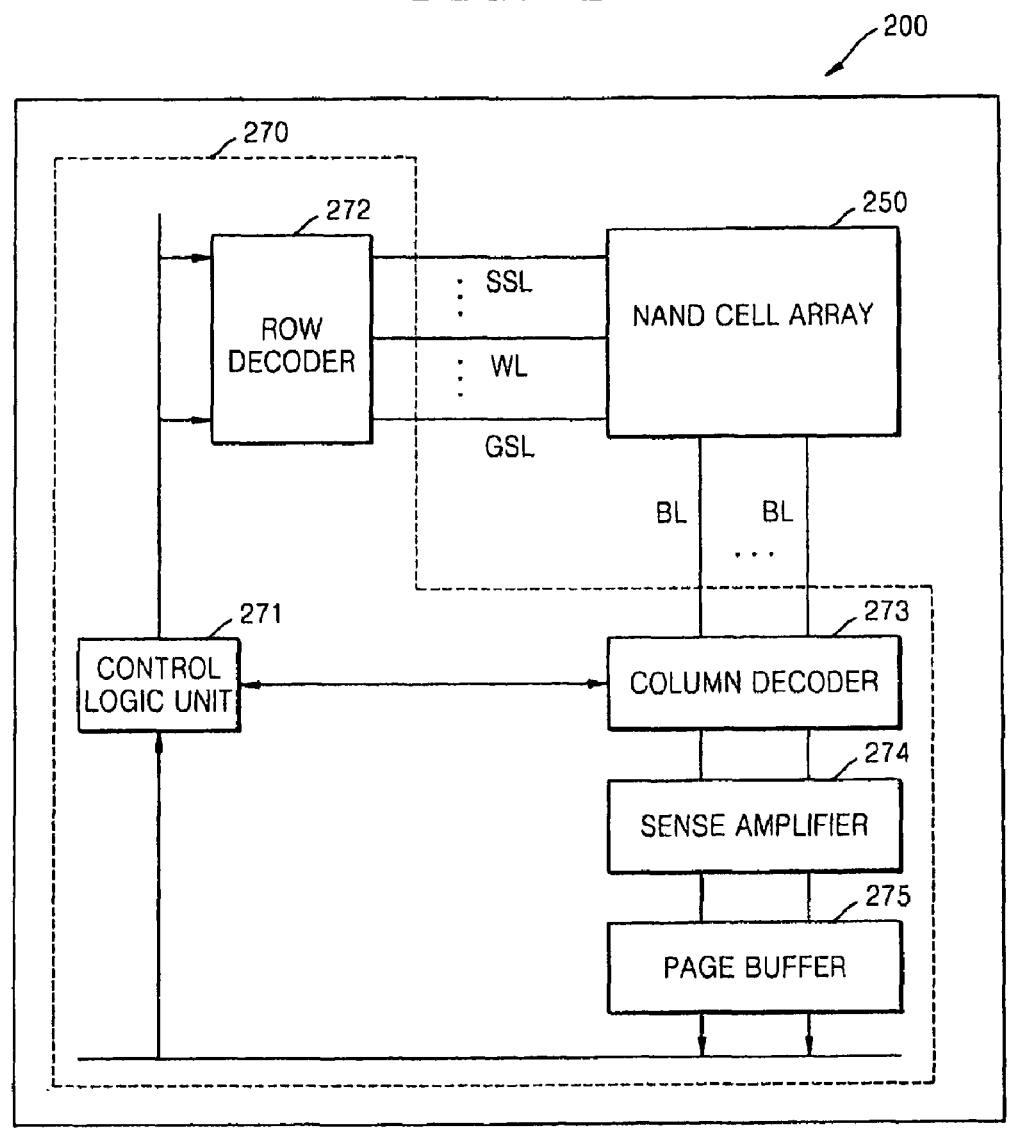
FIG. 15 is a schematic block diagram of another embodiment of a non-volatile memory system, according to aspects of the inventive concept.

FIG. 15 is an embodiment of a schematic block diagram of a non-volatile memory system according to another aspect of the inventive concept. Referring to FIG. 15, a NAND cell array 250 may be combined with a core circuit unit 270. For example, the NAND cell array 250 may include a non-volatile memory as described above. The core circuit unit 270 may include a control logic unit 271, a row decoder 272, a column decoder 273, a sense amplifier 274, and/or a page buffer 275.

The control logic unit 271 may communicate with the row decoder 272, the column decoder 273 and/or the page buffer 275. The row decoder 272 may communicate with the NAND cell array 250 having a stacked structure via string selection lines SSL, word lines WL and/or ground selection lines GSL.

The column decoder 273 may communicate with the NAND cell array 250 via bit lines BL. The sense amplifier 274 may be electrically connected to the column decoder 273 when it receives a signal from the NAND cell array 250 and may be electrically disconnected from the column decoder 273 when it transmits a signal to the NAND cell array 250.

For example, the control logic unit 271 may transmit a row address signal to the row decoder 272, and the row decoder 272 may decode the row address signal and transmit the decoded signal to the NAND cell array 250 via the string selection lines SSL, the word lines WL, and the ground selection lines GSL. The control logic unit 271 may transmit a column address signal to the column decoder 273 or the page buffer 275, and the column decoder 273 may decode this signal and transmit the decoded signal to the NAND cell array 250 via the bit lines BL. A signal output from the NAND cell array 250 having the stacked structure may be delivered to the sense amplifier 274 via the column decoder 273 and be amplified by the sense amplifier 274, and the result of amplification may be delivered to the control logic unit 271 via the page buffer 275.

Figure 16:
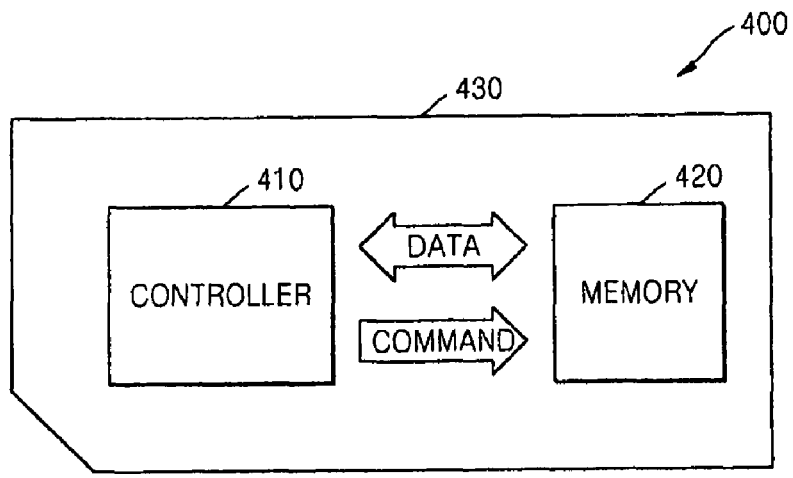
FIG. 16 is a schematic block diagram of an embodiment of a memory card, according to aspects of the inventive concept.

FIG. 16 is an embodiment of a schematic block diagram of a memory card 400 according to an aspect of the inventive concept. Referring to FIG. 16, the memory card 400 may include a controller 410 and a memory 420 in a housing 430. The controller 410 and the memory 420 may exchange an electrical signal with each other. For example, data may be exchanged between the memory 420 and the controller 410 in response to a command given from the controller 410. Thus, the memory card 400 may store data in the memory 420 or may output data stored in the memory 420 to the outside.

For example, the memory 420 may include a non-volatile memory device as described above. The memory card 400 may be used as a data storage medium in various portable apparatuses. For example, the memory card 400 may include a multi-media card (MMC) or a secure digital (SD) card.

Figure 17:
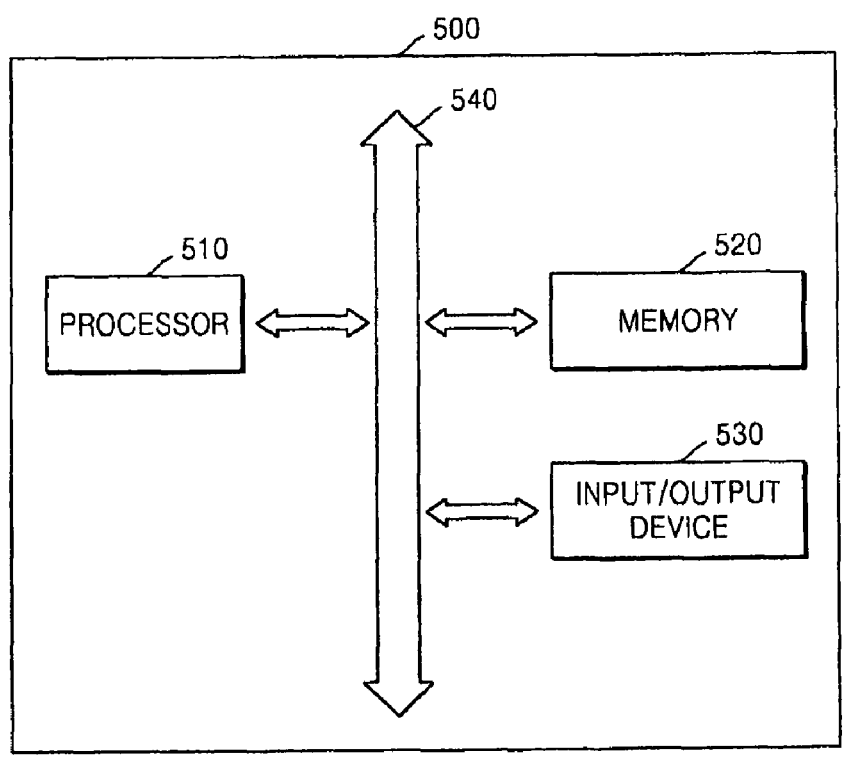
FIG. 17 is a schematic block diagram of an embodiment of an electronic system, according to aspects of the inventive concept.

FIG. 17 is a schematic block diagram of an electronic system 500 according to an embodiment of the inventive concept. Referring to FIG. 17, the electronic system 500 may include a processor 510, a memory chip 520, and an input/output device 530, and data communication may be established among the processor 510, the memory chip 520 and the input/output device 530 via a bus 540. The processor 510 may execute a program and control the electronic system 500. The input/output device 530 may be used in order to input data to or output data from the electronic system 500. The electronic system 500 may be connected to an external device, e.g., a personal computer (PC) or a network, in order to exchange data with the external device via the input/output device 530. The memory 520 may store code and data for operating the processor 510. For example, the memory 420 may include a non-volatile memory device as described above.

For example, the electronic system 500 may constitute various electronic control apparatuses that access and/or rely on information in the memory 520, and/or that store information in the memory 520. For example, the electronic system 500 may be used in mobile phones, MP3 players, navigation devices, solid state disks (SSDs) or household appliances to name just a few examples of possible electronic systems.

While the foregoing has described what are considered to be the best mode and/or other preferred embodiments, it is understood that various modifications can be made therein and that the inventive concept may be implemented in various forms and embodiments, and that they may be applied in numerous applications, only some of which have been described herein. It is intended by the following claims to claim that which is literally described and all equivalents thereto, including all modifications and variations that fall within the spirit and scope of the following claims.

What is claimed is:

1. A non-volatile memory device having a vertical structure, the non-volatile memory device comprising:
   a substrate;
   a semiconductor pole formed on the substrate to extend vertically with respect to the substrate;
   a NAND string formed on the substrate to extend vertically with respect to the substrate and along sidewalls of the semiconductor pole, the NAND string comprising a plurality of memory cells arranged in series and at least one pair of first selection transistors adjacent to the plurality of memory cells;
   a plurality of word lines coupled to the plurality of memory cells of the NAND string; and
   a first selection line commonly coupled to the at least one pair of first selection transistors of the NAND string.

2. The non-volatile memory device of claim 1, further comprising:
   a bit line connected to a first end of the NAND string; and
   a common source line connected to a second end of the NAND string proximate to the substrate and opposite to the bit line.

3. The non-volatile memory device of claim 2, wherein the at least one pair of first selection transistors is arranged between the bit line and the plurality of memory cells.

4. The non-volatile memory device of claim 2, wherein the at least one pair of first selection transistors is arranged between the common source line and the plurality of memory cells.

5. The non-volatile memory device of claim 1, wherein the NAND string further comprises at least one pair of second selection transistors adjacent to a second end of the plurality of memory cells and opposite to the at least one pair of first selection transistors.

6. The non-volatile memory device of claim 5, further comprising a second selection line commonly connected to the at least one pair of second selection transistors of the NAND string.

7. The non-volatile memory device of claim 1, wherein the plurality of memory cells comprise control gate electrodes on the sidewall of the semiconductor pole, and
   the at least one pair of first selection transistors comprise first gate electrodes on the sidewall of the semiconductor pole.

8. The non-volatile memory device of claim 7, wherein the difference between a gate length of each of the control gate electrodes and a gate length of each of the first gate electrodes is in a range of about 0 nm to 10 nm.

9. The non-volatile memory device of claim 1, wherein the NAND string further comprises at least one pair of second selection transistors adjacent to the plurality of memory cells and opposite to the at least one pair of first selection transistors.

10. The non-volatile memory device of claim 9, further comprising a second selection line commonly coupled to the at least one pair of second selection transistors of the NAND string.

* * * * *